(12) United States Patent
Kim et al.

(10) Patent No.: US 7,910,389 B2
(45) Date of Patent: Mar. 22, 2011

(54) VERTICAL SEMICONDUCTOR LIGHT-EMITTING DEVICE AND METHOD OF MANUFACTURING THE SAME

(75) Inventors: Hyun-Soo Kim, Hwaseong-si (KR); Kyu-Ho Shin, Seoul (KR); Jae-Hee Cho, Yongin-si (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 82 days.

(21) Appl. No.: 12/216,015

(22) Filed: Jun. 27, 2008

(65) Prior Publication Data
US 2008/0274575 A1 Nov. 6, 2008

Related U.S. Application Data

(62) Division of application No. 11/513,183, filed on Aug. 31, 2006, now abandoned.

(51) Int. Cl.
*H01L 21/00* (2006.01)
(52) U.S. Cl. .............. 438/48; 438/47; 257/E33.025
(58) Field of Classification Search ........... 257/E21.601, 257/E33.056, E33.025; 438/48, 47, 46
See application file for complete search history.

(56) References Cited

U.S. PATENT DOCUMENTS

| | | | |
|---|---|---|---|
| 6,071,795 A * | 6/2000 | Cheung et al. | 438/458 |
| 6,845,184 B1 | 1/2005 | Yoshimura et al. | |
| 6,913,985 B2 * | 7/2005 | Ogihara et al. | 438/462 |
| 2003/0189212 A1 * | 10/2003 | Yoo | 257/79 |
| 2003/0189215 A1 * | 10/2003 | Lee et al. | 257/94 |
| 2004/0033638 A1 * | 2/2004 | Bader et al. | 438/46 |
| 2005/0227455 A1 * | 10/2005 | Park et al. | 438/458 |
| 2005/0272176 A1 * | 12/2005 | Guo et al. | 438/29 |
| 2006/0154390 A1 | 7/2006 | Tran et al. | |
| 2007/0212854 A1 * | 9/2007 | Chu et al. | 438/464 |

FOREIGN PATENT DOCUMENTS

| JP | 2005-012188 | 1/2005 |
|---|---|---|
| KR | 10-2005-0012729 | 2/2005 |

OTHER PUBLICATIONS

Korean Office Action in corresponding Korean Application No. 10-2005-0058640, with English Translation, Mar. 24, 2008.

* cited by examiner

*Primary Examiner* — Chuong A Luu
*Assistant Examiner* — Nga Doan
(74) *Attorney, Agent, or Firm* — Harness, Dickey & Pierce, P.L.C.

(57) ABSTRACT

Provided is a vertical semiconductor light-emitting device and a method of manufacturing the same. The method may include sequentially forming a lower clad layer, an active layer, and an upper clad layer on a substrate to form a semiconductor layer and forming first electrode layers on the upper clad layer. A metal support layer may be formed on each of the first electrode layers and a trench may be formed between the first electrode layers. The substrate may be removed and a second electrode layer may be formed on the lower clad layer.

13 Claims, 11 Drawing Sheets

VERTICAL SEMICONDUCTOR LIGHT-EMITTING DEVICE AND METHOD OF MANUFACTURING THE SAME

PRIORITY STATEMENT

This application is a Divisional Application of U.S. application Ser. No. 11/513,183, filed Aug. 31, 2006, now abandoned, the entire contents of which are incorporated herein by reference.

BACKGROUND

1. Field

Example embodiments relate to a semiconductor light-emitting device. Other example embodiments relate to a method of manufacturing a vertical semiconductor light-emitting device by a simpler process in which yield is improved.

2. Description of the Related Art

In general, light emitting diodes (LED) may be used to transmit a signal obtained by converting electrical energy into the shape of infra rays, visible rays and/or light using properties of a compound semiconductor. LED may be a type of electroluminescent (EL) devices. LED using a Group III-V compound semiconductor have been used.

Group III nitride-based compound semiconductors may be direct transition type semiconductors. A relatively stable operation may be performed at higher temperatures than in devices using semiconductors other than Group III nitride-based compound semiconductors. The Group III nitride-based compound semiconductors have been used in light-emitting devices (e.g., an LED and/or a laser diode (LD)). Group III nitride-based compound semiconductors may be formed on a substrate formed of sapphire ($Al_2O_3$).

FIG. 1 illustrates a conventional semiconductor light-emitting device. Referring to FIG. 1, a lower clad layer 12, an active layer 13 and an upper clad layer 14 may be sequentially formed on a substrate 11 formed of sapphire. An upper electrode layer 15 may be formed on the upper clad layer 14 and a lower electrode layer 16 may be formed on a region of the lower clad layer 12 in which the active layer 13 is not formed. For a GaN-based light-emitting device, the lower clad layer 12 may be formed of n-GaN, the active layer 13 may be formed of a multi quantum wall (MQW) structure of InGaN/GaN, and the upper clad layer 14 may be formed of p-GaN. The upper electrode layer 15 may include a contact layer containing a transparent conductive material (e.g., indium tin oxide (ITO), Ru/Au and/or Ni/Au) and a pad structure containing Au formed on a portion of an upper region of the contact layer. Ti/Al may be used in the lower electrode layer 16.

The lower electrode layer 16 and the upper electrode layer 15 may be formed on one surface of the substrate 11 and may have difficulty applying a potential when a light-emitting surface may be relatively narrow. Because current applied to the active layer 13 through the lower electrode layer 16 may pass through the lower clad layer 12 disposed below the lower electrode layer 16, the structure may not be desirable. A vertical semiconductor light-emitting device may have improved characteristics compared to the above-described horizontal semiconductor light-emitting device illustrated in FIG. 1. Because the substrate may be removed, the lower electrode layer 16 may be formed below the lower clad layer 12. A light-emitting area may be increased and heat dissipation may be more smoothly performed.

FIGS. 2A-2H illustrate a conventional method of manufacturing a vertical semiconductor light-emitting device. Referring to FIG. 2A, an n-GaN buffer layer 124, an InGaN/GaN active layer 126 and a p-GaN contact layer 128 may be sequentially formed on a sapphire substrate 122. Referring to FIG. 2B, trenches 130 may be formed through the p-GaN contact layer 128 exposing the surface of the sapphire substrate 122. The trenches 130 may serve to assist a subsequent chip separation process.

Referring to FIG. 2C, a contact layer 150 may be formed of a material selected from the group including Pt/Au, Pd/Au, Ru/Au and Ni/Au. The contact layer 150 may be formed on the p-GaN contact layer 128. Referring to FIG. 2D, the trenches 130 may be filled with a photoresist (PR) 154. Referring to FIG. 2E, a metal support layer 156 may be formed by applying Cu, Cr, Ni, Au and/or Ag onto the contact layer 150. The metal support layer 156 may be formed by a dicing process. The metal (e.g., Cu) may be relatively ductile and thus, the dicing process may not be easily performed. Referring to FIG. 2F, the sapphire substrate 122 may be removed by irradiating laser light 158 using an excimer laser. Referring to FIG. 2G, the PR 154 may be removed. Referring to FIG. 2H, an n-type ohmic contact layer 160 may be formed on the n-GaN buffer layer 124 using Ti/Al.

SUMMARY

Example embodiments relate to a semiconductor light-emitting device. Other example embodiments relate to a method of manufacturing a vertical semiconductor light-emitting device by a simpler process in which yield is improved.

According to example embodiments, a method of manufacturing a vertical semiconductor light-emitting device may include sequentially forming a lower clad layer, an active layer, and an upper clad layer on a substrate to form a semiconductor layer. First electrode layers may be formed on the upper clad layer, a metal support layer may be formed on each of the first electrode layers and a trench may be formed between the first electrode layers. The substrate may be removed and a second electrode layer may be formed on the lower clad layer. The substrate may be a sapphire substrate. The lower clad layer and the upper clad layer may include a nitrification gallium-based material. The active layer may be formed of multi quantum wall (MQW) structure of InGaN/GaN.

The forming of the metal support layer may include forming a seed layer on the upper clad layer and on a surface of each of the first electrode layers. A photoresist (PR) layer may be formed on the seed layer between the first electrode layers. A metal support layer may be formed on the seed layer corresponding to each of the first electrode layers and the PR layer may be removed which may form a trench in a region from which the PR layer is removed. The trench may be formed using a reactive ion etching (RIE) process.

The removing of the substrate and the forming of the second electrode layer may include forming a filling layer including an adhesion material on the trench region and on the surface of each of the metal support layers, attaching one of glass, silicon (Si) or sapphire onto the filling layer to form a bonding layer and removing the substrate. The filling layer may be formed of wax and may be removed using acetone. The substrate may be separated from the lower clad layer by irradiating laser light having a wavelength less than about 370 nm. The second electrode layer may be an n-type conductive material. The metal support layer may be formed using plasma vapor deposition (PVD) and/or chemical vapor deposition (CVD).

According to example embodiments, a vertical semiconductor light-emitting device may include a first electrode layer on a semiconductor layer, a seed layer and a metal support layer on the first electrode layer, a second electrode layer below the semiconductor layer and an insulating support layer that separates the vertical semiconductor light-emitting device from another vertical semiconductor light-emitting device. The semiconductor layer may be formed of a lower clad layer, an active layer and an upper clad layer. The second electrode layer may be made of an n-type conductive material. The first electrode layer may be made of a p-metal. The metal support layer may be made of one of the group including Cu, Cr, Ni, Ag, Au, Mo, Pd, W and/or Al. The seed layer may be used to form the metal support layer and may be made of one of the group including Cr, Ti, Au and/or Ni. The insulating support layer may be an adhesive polymer film (e.g., polycarbonate).

BRIEF DESCRIPTION OF THE DRAWINGS

Example embodiments will be more clearly understood from the following detailed description taken in conjunction with the accompanying drawings. FIGS. 1-5C represent non-limiting, example embodiments as described herein.

FIG. 1 illustrates a conventional semiconductor light-emitting device;

FIG. 3 illustrates a structure of a vertical semiconductor light-emitting device according to example embodiments;

FIGS. 5A-5C show images formed during the method of manufacturing a vertical semiconductor light-emitting device illustrated in FIGS. 4A-4I.

DETAILED DESCRIPTION OF EXAMPLE EMBODIMENTS

Figure 1:
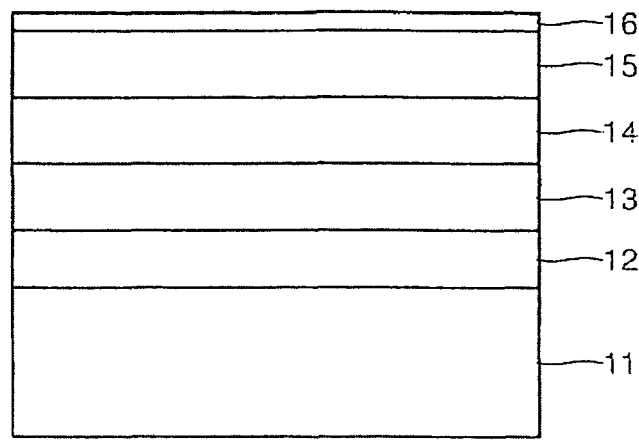
Figure 2A:
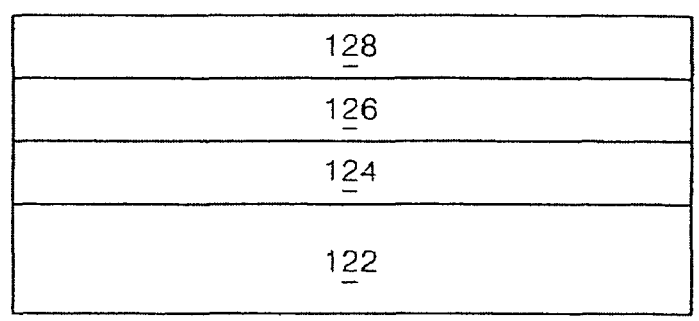
FIGS. 2A-2H illustrate a conventional method of manufacturing a vertical semiconductor light-emitting device.
Figure 2B:
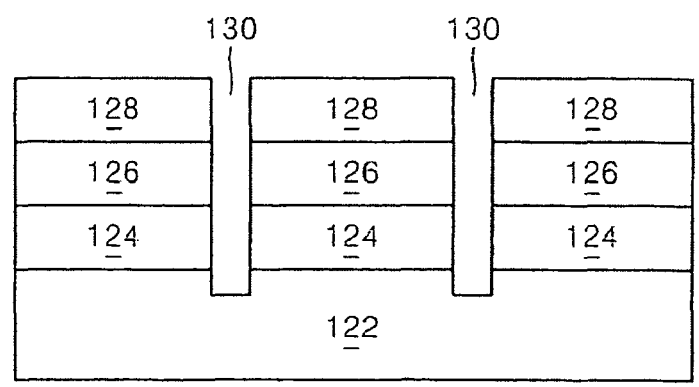
Figure 2C:
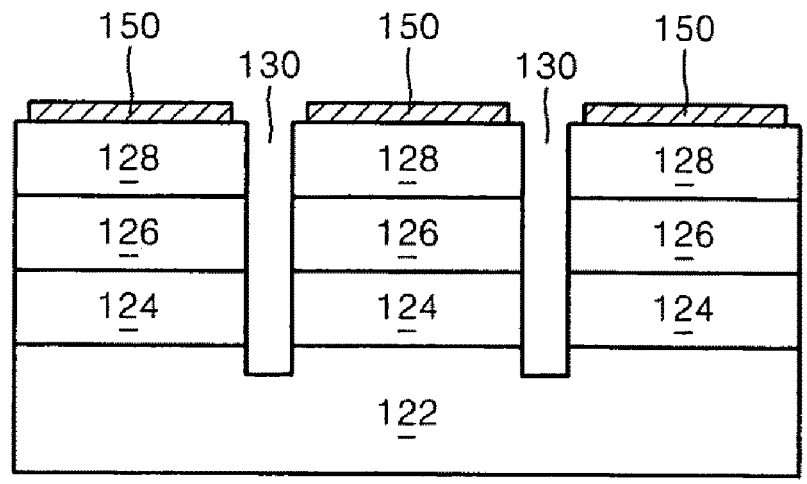
Figure 2D:
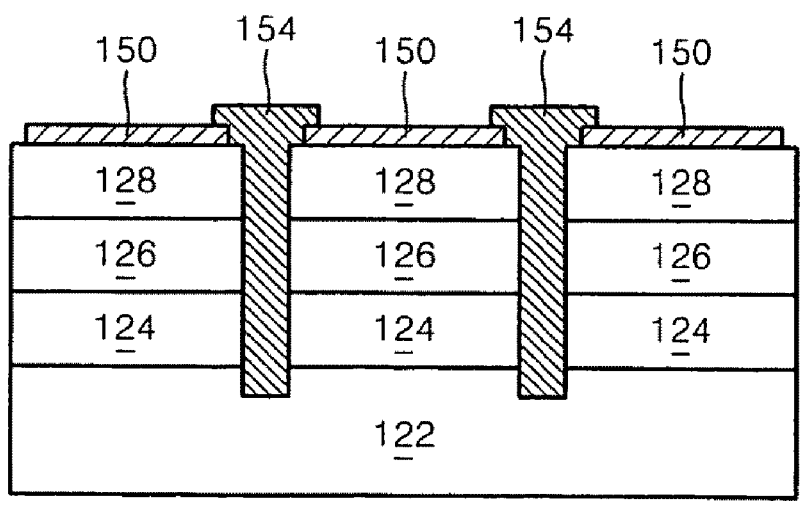
Figure 2E:
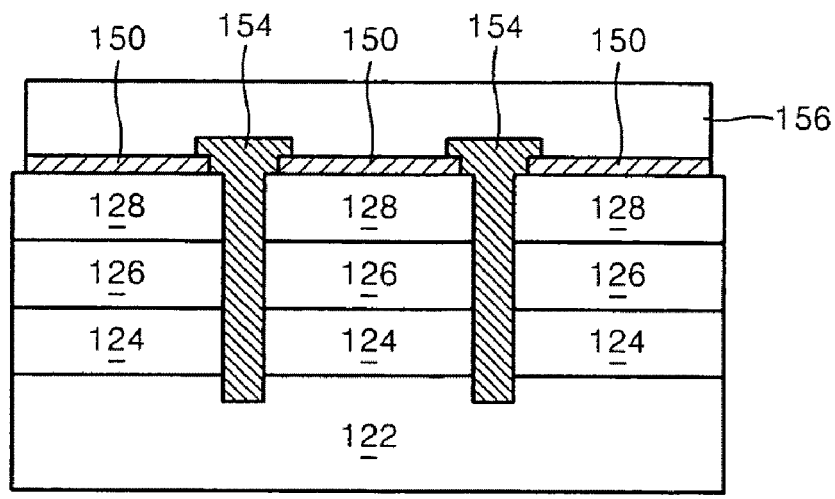
Figure 2F:
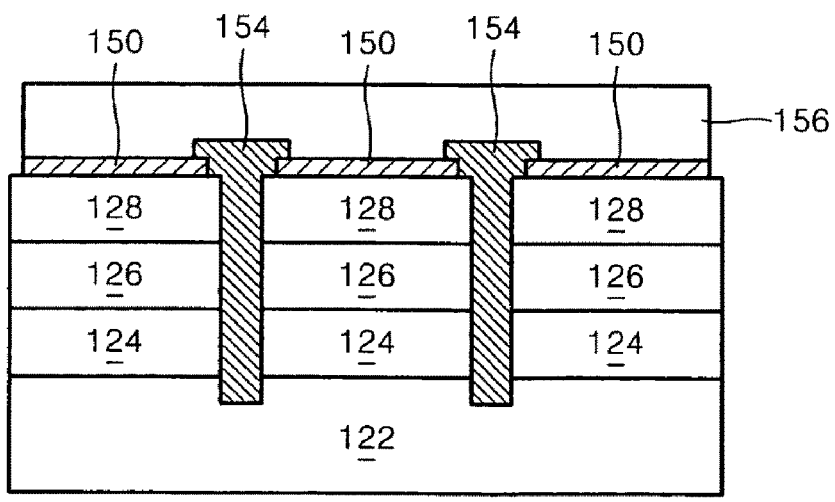
Figure 2G:
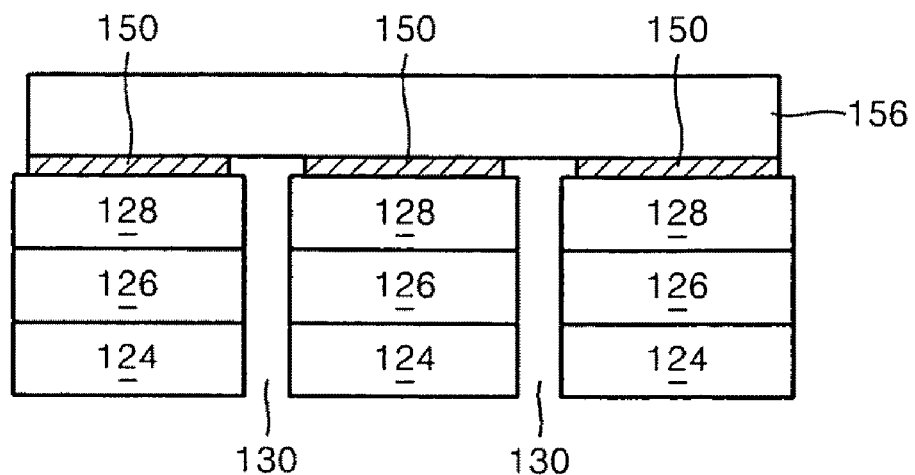
Figure 2H:
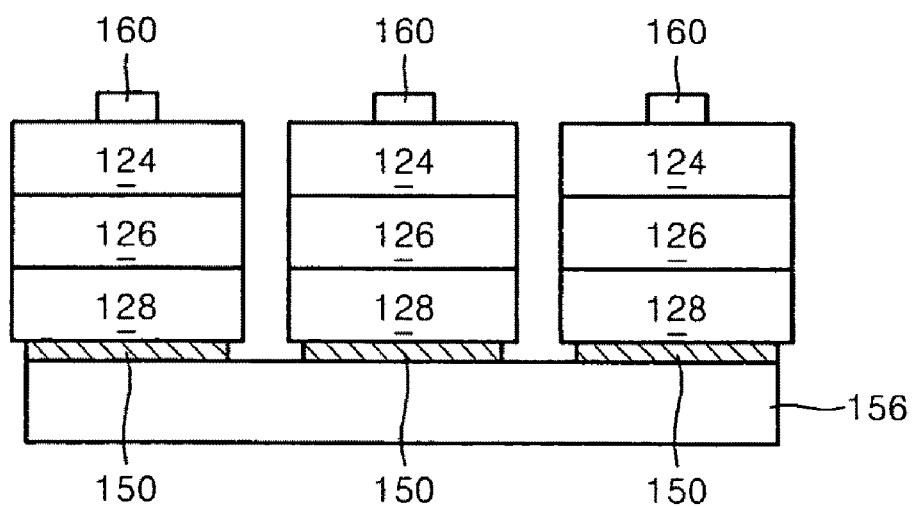

Example embodiments will now be described more fully hereinafter with reference to the accompanying drawings, in which preferred embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. In the drawings, the thicknesses of layers and regions are exaggerated for clarity. Like reference numerals refer to like elements throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. The example term "below" can encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
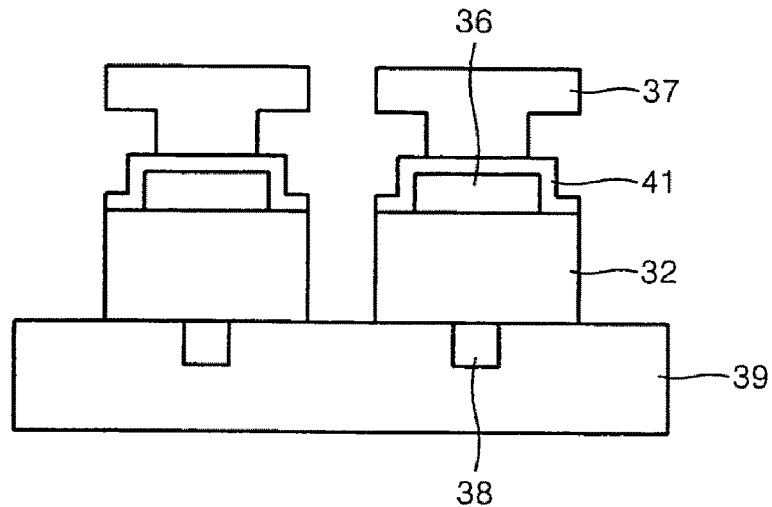

FIG. 3 illustrates a structure of a vertical semiconductor light-emitting device according to example embodiments. Referring to FIG. 3, a first electrode layer 36 may be formed on a semiconductor layer 32, and a seed layer 41 and a metal support layer 37 may be sequentially formed on the first electrode layer 36. A second electrode layer 38 may be formed below the semiconductor layer 32. An insulating support layer 39 may be formed to separate vertical semiconductor light-emitting devices from one another. The insulating support layer 39 may be an adhesive polymer film (e.g., polycarbonate).

Figure 4A:
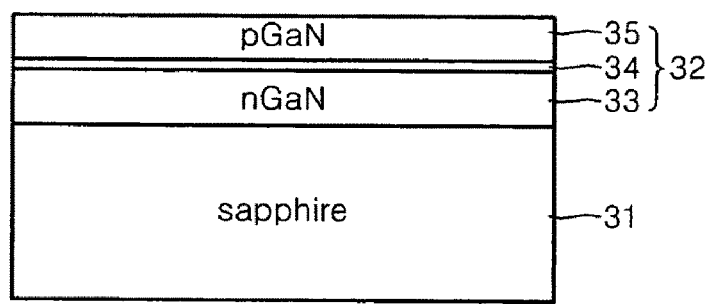
FIGS. 4A-4I illustrate a method of manufacturing a vertical semiconductor light-emitting device according to example embodiments.

A method of manufacturing a vertical semiconductor light-emitting device according to example embodiments will now be described with reference to FIGS. 4A-4I. Referring to FIG. 4A, a compound semiconductor layer may be formed on a sapphire substrate 31. In detail, a lower clad layer 33, an active layer 34, and an upper cladlayer 35 may be sequentially formed on the sapphire substrate 31. For example, the lower clad layer 33 may be formed of n-GaN, the active layer 34 may be formed of multi quantum wall (MQW) structure of InGaN/GaN, and the upper clad layer 35 may be formed of p-GaN. The lower clad layer 33, the active layer 34, and the upper clad layer 35 may be referred to as a semiconductor layer 32.

Figure 4B:
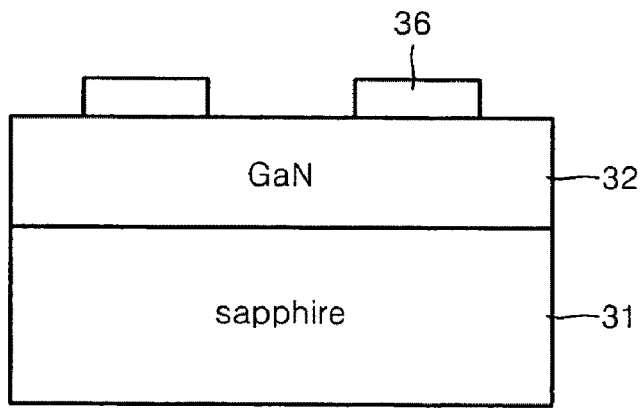

Referring to FIG. 4B, a first electrode layer 36 may be formed on the semiconductor layer 32. The first electrode layer 36 may be formed of a p-metal. The first electrode layer 36 may be formed by applying metal (e.g., Ni/Ag and/or Ru) using a process, for example, sputtering and/or evaporation.

Figure 4C:
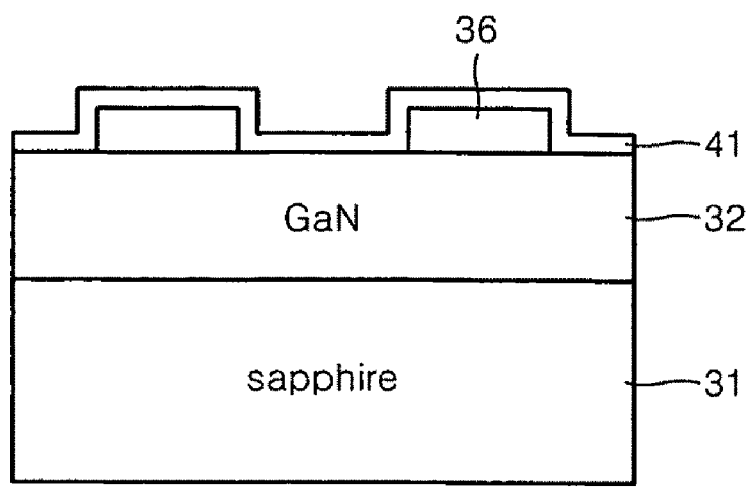
Figure 4D:
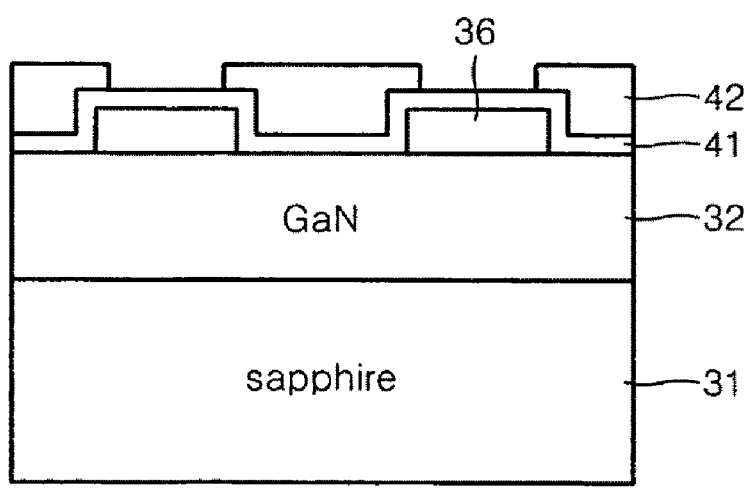

Referring to FIGS. 4C and 4D, a seed layer 41 may be formed on the first electrode layer 36 and the semiconductor layer 32. The seed layer 41 may be used to form a metal support layer 37 of FIG. 4E. The seed layer 41 may be formed of metal (e.g., Cr, Ti, Au and/or Ni) at a relatively small thickness of several tens of nm. A photoresist (PR) layer 42 having a thickness of several to several tens of micrometers may be formed by applying and patterning a photoresist (PR) onto a region of the seed layer 41 in which the first electrode layer 36 is not formed. FIG. 5A is plan view in which the seed layer 41 may be formed of Cr having a thickness of about 100 nm and the PR layer 42 having a thickness of about 5 micrometers may be formed, in an upward direction of FIG. 4D.

Figure 4E:
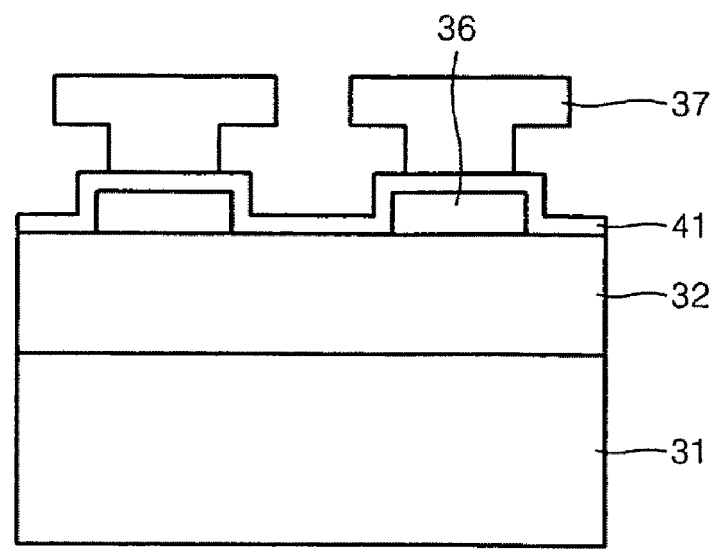
Figure 4F:
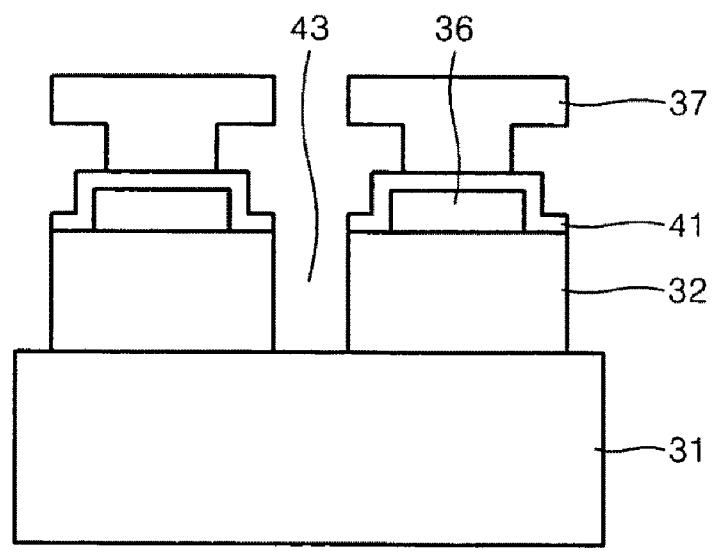
Figure 5A:
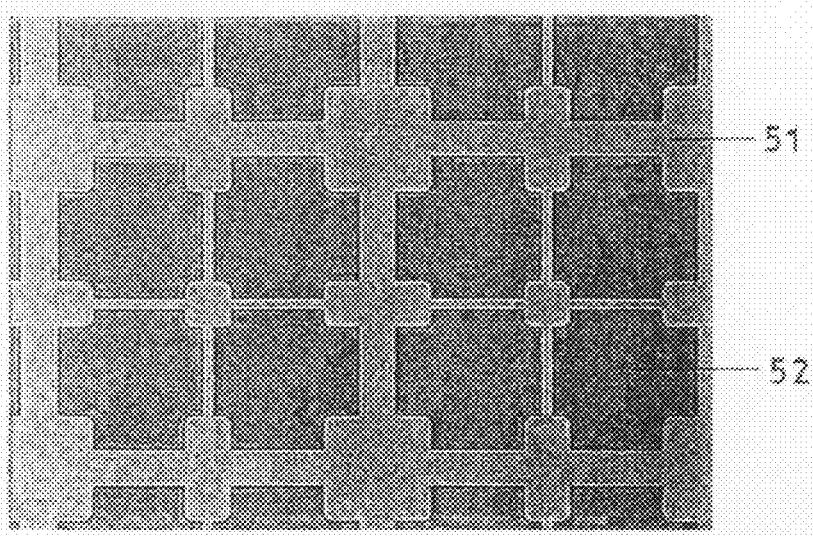
Figure 5B:
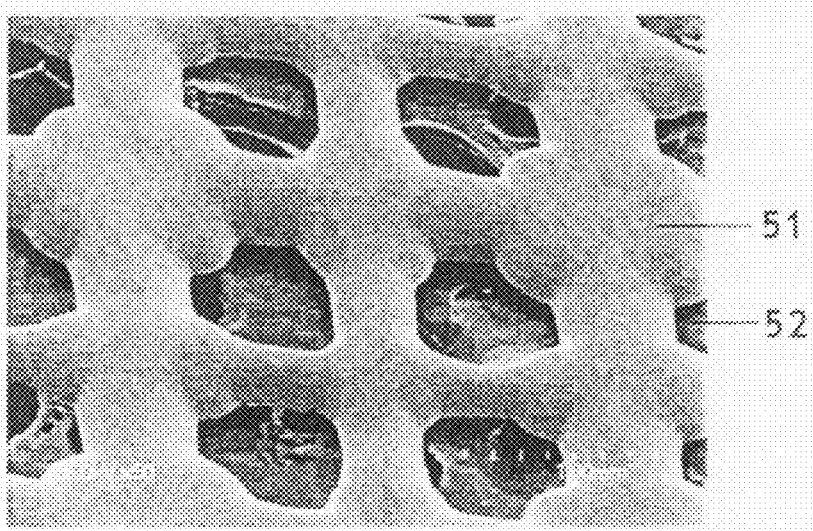

Referring to FIG. 4E, the metal support layer 37 may be formed by applying metal (e.g., Cu, Cr, Ni, Ag, Au, Mo, Pd, W and/or Al) onto the exposed region of the seed layer 41. The metal support layer 37 may be formed using plasma vapor deposition (PVD) and/or chemical vapor deposition (CVD), for example, sputtering, electroplating and/or an electroless plating process. The PR layer 42 may be removed. In FIG. 4E, an end portion of an upper surface of the metal support layer 37 may be angled. The end portion of the upper surface of the metal support layer 37 may be formed in the form of a mushroom which is an actual image illustrated in FIG. 5B. By removing the PR layer 42, there may be a step difference between an end portion of a metal support layer 51 and a seed layer 52 formed below the metal support layer 51, as illustrated in FIG. 5C.

Figure 5C:
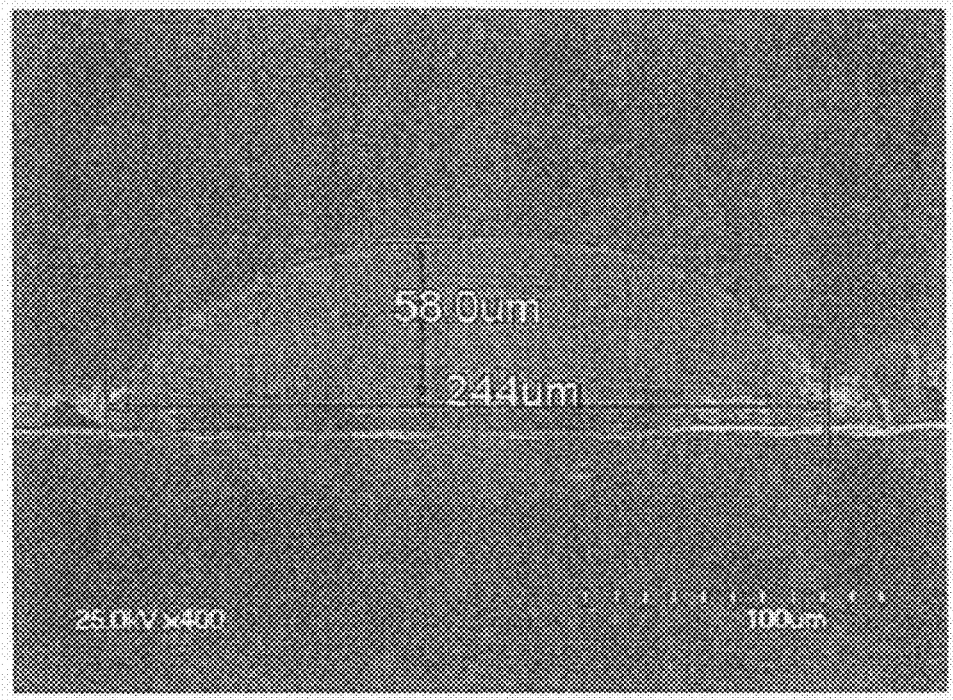

As seen in FIG. 5C, in a conventional method of manufacturing a vertical semiconductor light-emitting device, a Cu plate may be formed on a p-type electrode so that a dicing process may be performed to form a unit device in a subsequent process. In the method of manufacturing a vertical semiconductor light-emitting device according to example embodiments, the metal support layers 37 may be separated from one another according to unit devices. A subsequent additional dicing process of the metal support layer 37 may not be needed Referring to FIG. 4F, a trench 43 may be formed between the metal support layers 37 to expose the substrate 31. The width of the trench 43 may be greater than several micrometers. The trench 43 may be formed using reactive ion etching, for example, inductively coupled plasma reactive ion etching (ICP-RIE) process. An additional mask may not be needed in a process of forming the trench 43.

Figure 4G:
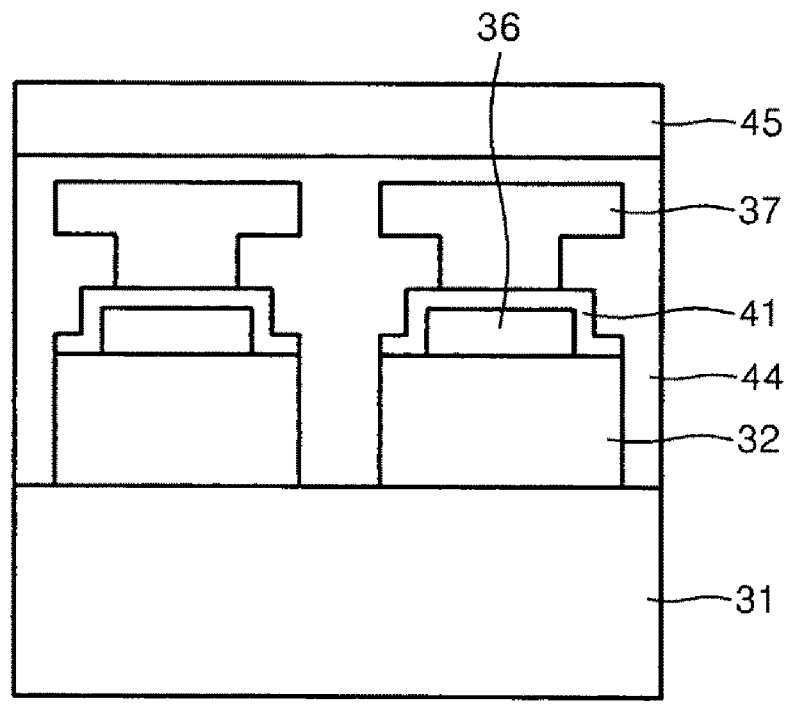

Referring to FIG. 4G, the trench 43 and the surface of the metal support layer 37 may be filled with a wax having an improved adhesion property, thereby forming a filling layer 44. Glass, silicon (Si) and/or sapphire may be attached to the filling layer 44 and may be heated to about 150° C., forming a bonding layer 45. The bonding layer 45 may be used to fix a device when the sapphire substrate 31 is removed in a subsequent process.

Figure 4H:
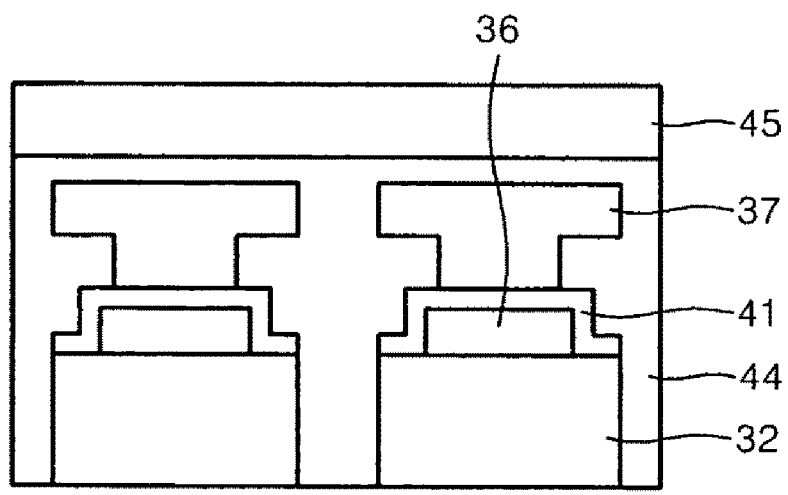

Referring to FIG. 4H, the substrate 31 disposed below the semiconductor layer 32 may be removed. A laser lift-off (LLO) process, using laser light having a wavelength less than about 370 nanometers, may be used. Heat may be generated between the sapphire substrate 31 and the semiconductor layer 32 by irradiating a laser light. A GaN semiconductor material, at a boundary between the substrate 31 and the semiconductor layer 32, may be decomposed so that the substrate 31 and the semiconductor layer 32 may be easily separated from each other. The separated semiconductor layer 32 may be planarized using a chemical mechanical polishing (CMP) and/or ICP-RIE polishing process.

Figure 4I:
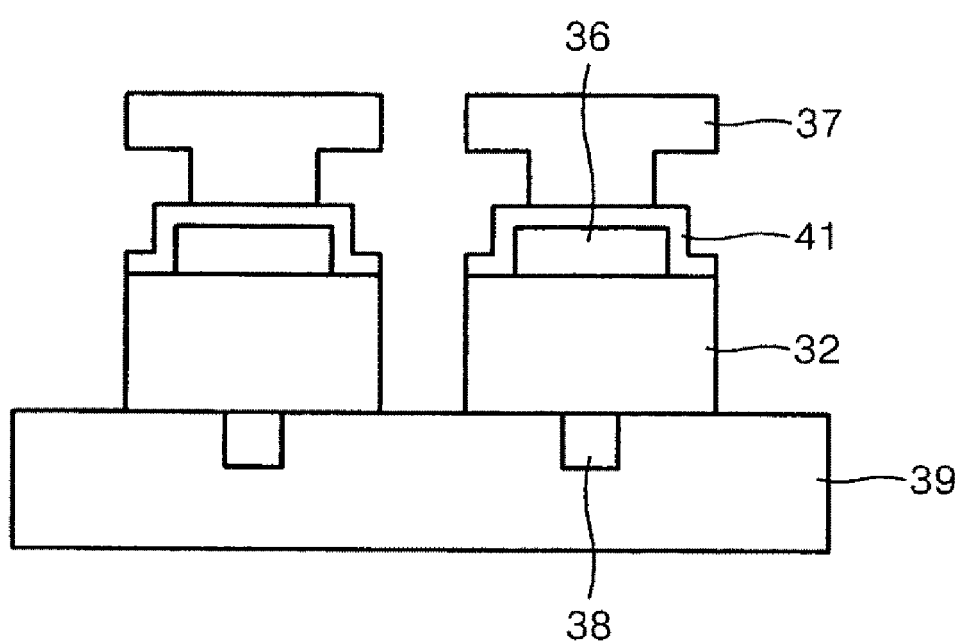

Referring to FIG. 4I, a second electrode layer 38 may be formed on a bottom surface of the semiconductor layer 32. The second electrode layer 38 may be formed of an n-type conductive material and may include Ti/Al, Ti/Cu and/or Ti/Ni. After a support layer 39 is formed below the second electrode layer 38 and the semiconductor layer 32, the filling layer 44 may be removed using acetone. The support layer 39 may be easily separated from the second electrode layer 38 and the semiconductor layer 32. Accordingly, a vertical semiconductor laser diode may be more easily formed in a unit device.

When a metal support layer is formed of Cu, a dicing process of the metal support layer may not need to be performed in order to form a unit device in a subsequent process. Structural stability of a light-emitting device may be sought and a relatively high yield may be obtained. Also, an additional mask may not be needed during a process of forming a trench. There may be no process that induces stress inside the semiconductor light-emitting device and relatively high productivity may be obtained with a relatively simple process.

While example embodiments have been particularly shown and described with reference to example embodiments thereof, it will be understood by those skilled in the art that various changes in form and details may be made therein without departing from the spirit and scope of the following claims.

What is claimed is:

1. A method of manufacturing a vertical semiconductor light-emitting device, the method comprising:
   sequentially forming a lower clad layer, an active layer, and an upper clad layer on a substrate to form a semiconductor layer;
   forming a plurality of first electrode layers separated from each other on the upper clad layer;
   forming metal support layers on each of the plurality of first electrode layers and forming a trench between the metal support layers by removing a portion of the lower clad layer, the active layer and the upper clad layer; and
   removing the substrate and forming a second electrode layer on the lower clad layer,
   wherein the trench has a width equal to a distance between two adjacent metal support layers from among the metal support layers.

2. The method of claim 1, wherein the substrate is a sapphire substrate.

3. The method of claim 1, wherein the lower clad layer and the upper clad layer include a nitrification gallium-based material.

4. The method of claim 1, wherein the active layer is formed of multi quantum wall (MQW) structure of InGaN/GaN.

5. The method of claim 1, wherein forming the metal support layers includes:
   forming a seed layer on the upper clad layer and on a surface of each of the plurality of first electrode layers;
   forming a photoresist (PR) layer on the seed layer between the plurality of first electrode layers;
   forming metal support layers on the seed layer corresponding to each of the plurality of first electrode layers; and
   removing the PR layer and forming a trench in a region from which the PR layer is removed.

6. The method of claim 5, wherein the trench is formed using a reactive ion etching (RIE) process.

7. The method of claim 1, wherein removing the substrate and the forming of the second electrode layer includes:
   forming a filling layer including an adhesion material on the trench region and on the surface of each of the metal support layers;
   attaching one of glass, silicon (Si) or sapphire onto the filling layer to form a bonding layer; and
   removing the substrate.

8. The method of claim 7, wherein the filling layer is formed of wax.

9. The method of claim 7, wherein the filling layer is removed using acetone.

10. The method of claim 1, wherein the substrate is separated from the lower clad layer by irradiating laser light having a wavelength less than about 370 nm.

11. The method of claim 7, wherein the substrate is separated from the lower clad layer by irradiating laser light having a wavelength less than about 370 nm.

12. The method of claim 1, wherein the second electrode layer is an n-type conductive material.

13. The method of claim 1, wherein the metal support layers are formed using plasma vapor deposition (PVD) or chemical vapor deposition (CVD).

* * * * *